United States Patent [19]
Kong

[11] Patent Number: 5,987,631
[45] Date of Patent: Nov. 16, 1999

[54] APPARATUS FOR MEASURING BIT ERROR RATIO USING A VITERBI DECODER

[75] Inventor: Jun-Jin Kong, Kyonggi-do, Rep. of Korea

[73] Assignee: Samsung Electronics Co., Ltd., Kyungki-do, Rep. of Korea

[21] Appl. No.: 08/944,647

[22] Filed: Oct. 6, 1997

[30] Foreign Application Priority Data

Oct. 4, 1996 [KR] Rep. of Korea ................... 96-44014

[51] Int. Cl.$^6$ ................................. G06F 11/00
[52] U.S. Cl. ................ 714/704; 714/795; 714/792
[58] Field of Search .................. 714/758, 786, 714/792, 794, 795, 704, 705, 707, 752, 746, 747

[56] References Cited

U.S. PATENT DOCUMENTS 5,581,577  12/1996  Abe ............................... 375/225
5,666,370  9/1997  Ganesan et al. ................. 371/37.01
5,796,757  8/1998  Czaja ................................. 371/46

*Primary Examiner*—Trinh L. Tu
*Attorney, Agent, or Firm*—Sughrue, Mion, Zinn, Macpeak & Seas, PLLC

[57] ABSTRACT

An apparatus for accurately measuring a bit error ratio by using a viterbi decoder to improve the performance of a communication system that uses cyclic redundancy codes and trellis codes to detect and correct errors. The apparatus generates new cyclic redundancy codes and substitutes them in place of the transmitted cyclic redundancy codes by using decoded data that has been processed by a viterbi decoder. The apparatus then regenerates trellis encoded data by using reconstructed data that contains the new cyclic redundancy codes. Finally, the re-encoded data are compared with the transmitted data to calculate a bit error ratio. The apparatus consists of a viterbi decoding unit, a cyclic redundancy code regeneration unit, a cyclic redundancy code selecting unit, a cyclic redundancy code generating unit, a trellis re-encoding unit, a time delaying unit, a data comparing unit and a bit error ratio measuring unit.

3 Claims, 3 Drawing Sheets

APPARATUS FOR MEASURING BIT ERROR RATIO USING A VITERBI DECODER

BACKGROUND OF THE INVENTION

1. Field of the Invention

The present invention relates to an apparatus for measuring a bit error ratio of a communication system using cyclic redundancy codes and trellis codes. More particularly, it relates to an apparatus for accurately measuring a bit error ratio by using a viterbi decoder to improve the performance of a communication system that uses cyclic redundancy codes and trellis codes to detect and correct errors. The apparatus generates new cyclic redundancy codes and substitutes them in place of the transmitted cyclic redundancy codes by using decoded data that has been processed by a viterbi decoder. The apparatus then re-generates trellis encoded data by using reconstructed data that contains the new cyclic redundancy codes. Finally, the re-encoded data are compared with the transmitted data to calculate a bit error ratio.

2. Description of the Prior Art

In general communication systems, error correction and decoding methods are used to correct errors that are generated while data passes through a transmission channel containing noise and other elements which inhibit communication. Two types of error correction and decoding methods are block decoding and trellis decoding. In the block decoding method, redundancy codes are added to a block of voice information to be transmitted. In the trellis decoding method, data which are input in order are decoded based on a function of the decoding method.

A method for measuring a bit error ratio will be described with reference to a signal treatment method based on a code division multiple access (CDMA) standard. This standard, which uses cyclic redundancy codes and trellis codes to detect and correct transmission errors, is used in a digital cellular phone system and a personal communication system in Korea.

Under the CDMA standard, voice signals are not transmitted at a predetermined rate, but are transmitted at one of four rates based on the magnitude of the voice signals which are detected by a voice activity detector. For example, when the voice activity detector detects voice signals which are in the most active state, voice signals are transmitted at 9600 bits per second (bps). However, when the voice signals are in an inactive state, the voice signals are transmitted at 1200 bps, the minimum transmission rate necessary to maintain a channel between base stations and terminals. A transmission rate of 4800 bps is used to change the voice signals from the active state into the inactive state and a transmission rate of 2400 bps is used to change the voice signals from the inactive state into the active state. By transmitting data at different rates based on the state of voice signals, communication channels can be maintained between base stations and terminals when the amount of data to be transmitted is small. This also allows the electric power required to transmit data to be used more efficiently resulting in reduced power consumption and a decrease in interference signals effecting other terminal users on the communication system.

As described above, cyclic redundancy codes, which are generated based on the transmission rate determined by the degree of activity of the voice signals, as a frame quality indicator, are added to voice information. The transmitted data provides the necessary parameters to determine whether the frames received at the receiving unit have errors and to determine the transmission rate of the received frames. For example, when data are transmitted at the rate of 9600 bps, a voice information block consisting of 172 bits is formed and combined with 12 bits of cyclic redundancy codes. Then, 8 encoded tail bits, which are set to zero, are added to construct a frame totaling 192 bits.

When data are transmitted at the rate of 4800 bps, a voice information block consisting of 80 bits is formed and combined with 8 bits of cyclic redundancy codes. Then, 8 encoded tail bits, which are set to zero, are added to construct a frame totaling 96 bits.

Finally, when data are transmitted at the rates of 1200 bps or 2400bps, no cyclic redundancy codes are combined with the voice information block and only encoded tail bits, which are set to zero, are added to construct a frame. Each frame described above is transmitted in 20 msec.

The CDMA communication system includes trellis codes that have a constraint length of 9 and an encoding ratio of 1/3. A trellis code function is expressed with 557, 663, and 711 by an octonary and whenever one data bit is input, three encoded data bits are output.

Under the CDMA standard, data processed by a cyclic redundancy code generating unit and a trellis encoding unit are transmitted by a radio channel through a symbol repetition unit, a block interleaving unit, a 64 array orthogonal modulating unit, a frequency spreading unit, a phase modulating unit, an intermediate frequency unit, and a radio frequency unit. A receiver demodulates data by processing them in similar units in reverse order from the way they were modulated by the transmitter.

The demodulated data from the transmitter are decoded by a viterbi decoder, which is a maximum likelihood decoder. The viterbi decoder determines whether the decoded data have errors based on the cyclic redundancy codes which were added prior to transmission.

In a communication system using the CDMA standard, information relating to the transmission rate determined by the transmitter voice activity detection unit is not transmitted to the receiver. Therefore, the transmission rate which is actually used to transmit the data, is set at one of the four rates described above, depending on the frame errors.

However, the transmission rate cannot be accurately determined solely by using the bit error ratio based on the method described above. Therefore, it is necessary to calculate a more accurate transmission rate by measuring the bit error ratio of the demodulated data at the receiver before the demodulated data are processed by the viterbi decoder, instead of using the bit error ratio of the transmitted data and the cyclic redundancy codes carried with the transmitted data.

FIG. 1 is a block diagram of a conventional apparatus for measuring a bit error ratio in which cyclic redundancy codes and trellis codes are applied based on the transmission rate.

A conventional apparatus for measuring a bit error ratio using cyclic redundancy codes and trellis codes includes the following components:

a viterbi decoding unit 10 that decodes trellis encoded data by using a maximum likelihood decoding method;

a trellis re-encoding unit 20 that re-encodes decoded data from the viterbi decoding unit 10;

a time delaying unit 30 that delays demodulated data for an amount of time necessary to compensate for the delay caused by the data being processed in the viterbi decoding unit 10 and trellis re-encoding unit 20;

a data comparing unit 40 that compares re-encoded data from the trellis re-encoding unit 20 with the time delayed data from the time delaying unit 30; and a bit error ratio measuring unit 50 that calculates the bit error ratio based on the error data from the data comparing unit 40.

The operation of the conventional apparatus for measuring a bit error ratio using cyclic redundancy codes and trellis codes will be described below with reference to FIG. 1.

Data which are demodulated by the receiver demodulator and which are processed by the transmitter trellis encoder contain encoded symbols and bits that carry errors generated by noise, fading, and interference signals in the transmission channel. The demodulated data, including bits with errors, are corrected by being processed in the viterbi decoding unit 10. The resulting decoded data are in the same frame form as the data output from the transmitter.

Next, the trellis re-encoding unit 20 receives the decoded data, including voice information and cyclic redundancy codes, in a frame form, and generates trellis re-encoded data in the same manner as the transmitter trellis encoder. Because errors generated during demodulation are corrected at a desired level, the decoded data output from the viterbi decoding unit 10 have less errors than the demodulated data input into the viterbi decoding unit 10. Therefore, it is presumed that the trellis re-encoded data are the same as the data encoded by the transmitter trellis encoding unit, prior to transmission. Then the data comparing unit 40 compares the trellis re-encoded data, which is regarded as the data prior to transmission, with the time delayed data, to find errors and generate error data. Finally, a bit error ratio measuring unit 50 divides the error data into bits having no errors and bits having errors and then calculates a bit error ratio.

The conventional bit error ratio measuring apparatus measures the bit error ratio based on the assumption that the decoded data are the same as the data output from the transmitter. However, if all the errors contained in the demodulated data are not corrected by the viterbi decoder, the decoded data will be different from the data input into the transmitter trellis encoding unit. Accordingly, the trellis re-encoded data will be different from the data output from the transmitter trellis encoding unit.

For example, because the conventional apparatus uses data with errors as a point of reference when measuring a bit error ratio, the conventional apparatus can construe demodulated data containing errors, that are input into the viterbi decoder, as data not containing errors. Therefore, the apparatus tends to calculate a lower bit error ratio than actually exists. This causes the data to continue to be transmitted at a higher transmission rate rather than a proper lower rate.

SUMMARY OF THE INVENTION

The present invention overcomes the problem of the conventional apparatus described above. An objective of the present invention to provide an apparatus for measuring a bit error ratio, in which new cyclic redundancy codes are generated in a manner similar to the way the cyclic redundancy codes were generated in the transmitter. This is done by using decoded data from a viterbi decoder and information about the existing cyclic redundancy codes to generate new cyclic redundancy codes which replace the existing cyclic redundancy codes prior to being input into the trellis re-encoding unit. This allows a bit error ratio to be measured accurately, which enables data to be transmitted at a rate less than the maximum rate, if necessary. This in turn helps reduce consumption of electric power at the terminal and increases the capability of the receiver.

To accomplish this objective, an apparatus for measuring a bit error ratio by using a viterbi decoder has been designed which comprises the following components:

a viterbi decoding unit that decodes demodulated trellis encoded data by using a maximum likelihood decoding method;

a trellis re-encoding unit that receives reconstructed data from the cyclic redundancy code regeneration unit and trellis encodes the reconstructed data in the same manner as performed by the transmitter trellis encoder; and a cyclic redundancy code regeneration unit, disposed between the viterbi decoding unit and the trellis re-encoding unit, that receives decoded data from the viterbi decoding unit, removes existing cyclic redundancy codes, and adds new cyclic redundancy codes.

The apparatus for measuring bit error ratio by using a viterbi decoder according to the present invention, further comprises:

a time delaying unit that receives and delays demodulated data for an amount of time necessary to compensate for the delay caused as data are processed by the viterbi decoding unit, the cyclic redundancy code regeneration unit, and the trellis re-encoding unit;

a data comparing unit that compares the re-encoded data from the trellis re-encoding unit with time delayed data from the time delaying unit and generates error data which include bits with errors and without errors; and a bit error ratio measuring unit that calculates a bit error ratio based on error data from the data comparing unit.

The cyclic redundancy code regeneration unit also comprises two subunits:

a cyclic redundancy code selecting unit that detects the number of existing cyclic redundancy code bits added prior to transmission and selects the method for adding the new cyclic redundancy codes; and a cyclic redundancy code generating unit that generates new cyclic redundancy codes, based on an input from the cyclic redundancy code selecting unit, and adds the new cyclic redundancy codes to the voice information.

DESCRIPTION OF A PREFERRED EMBODIMENT

A preferred embodiment of the present invention is described in detail below with reference to the accompanying drawings.

Figure 1:
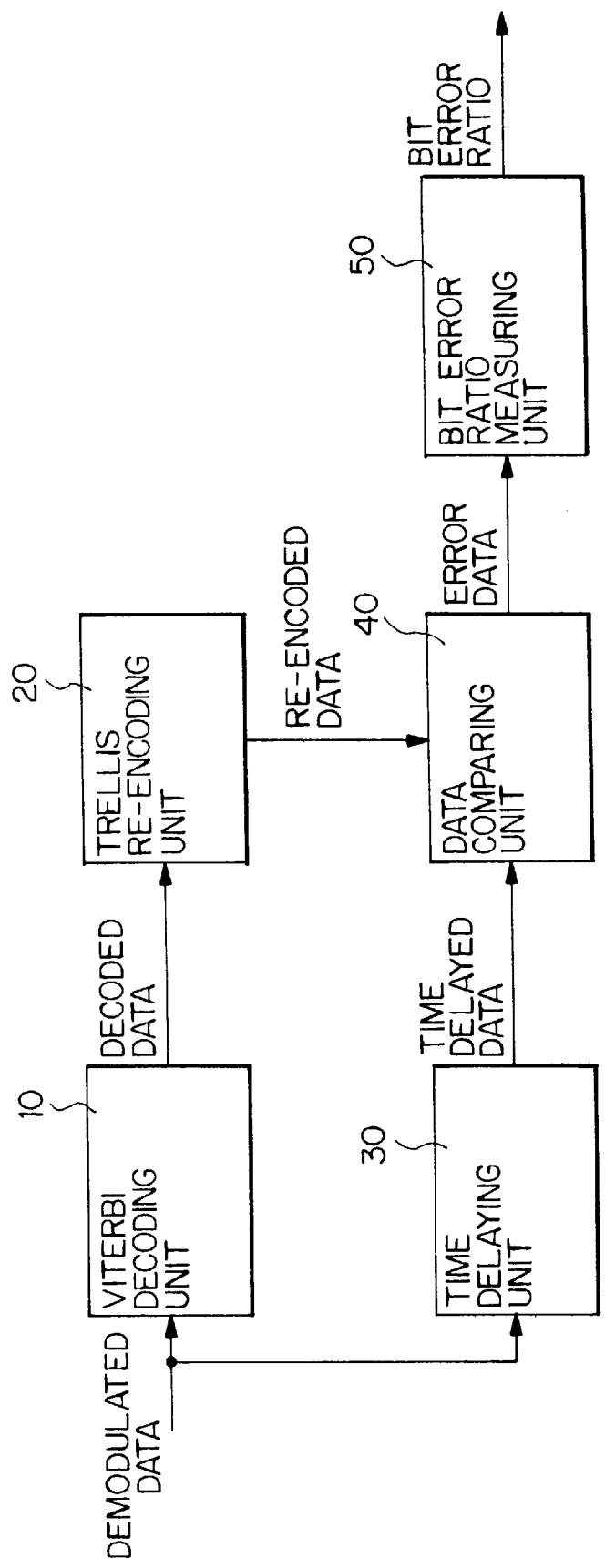
FIG. 1 is a block diagram of a conventional bit error ratio measuring apparatus.
Figure 2:
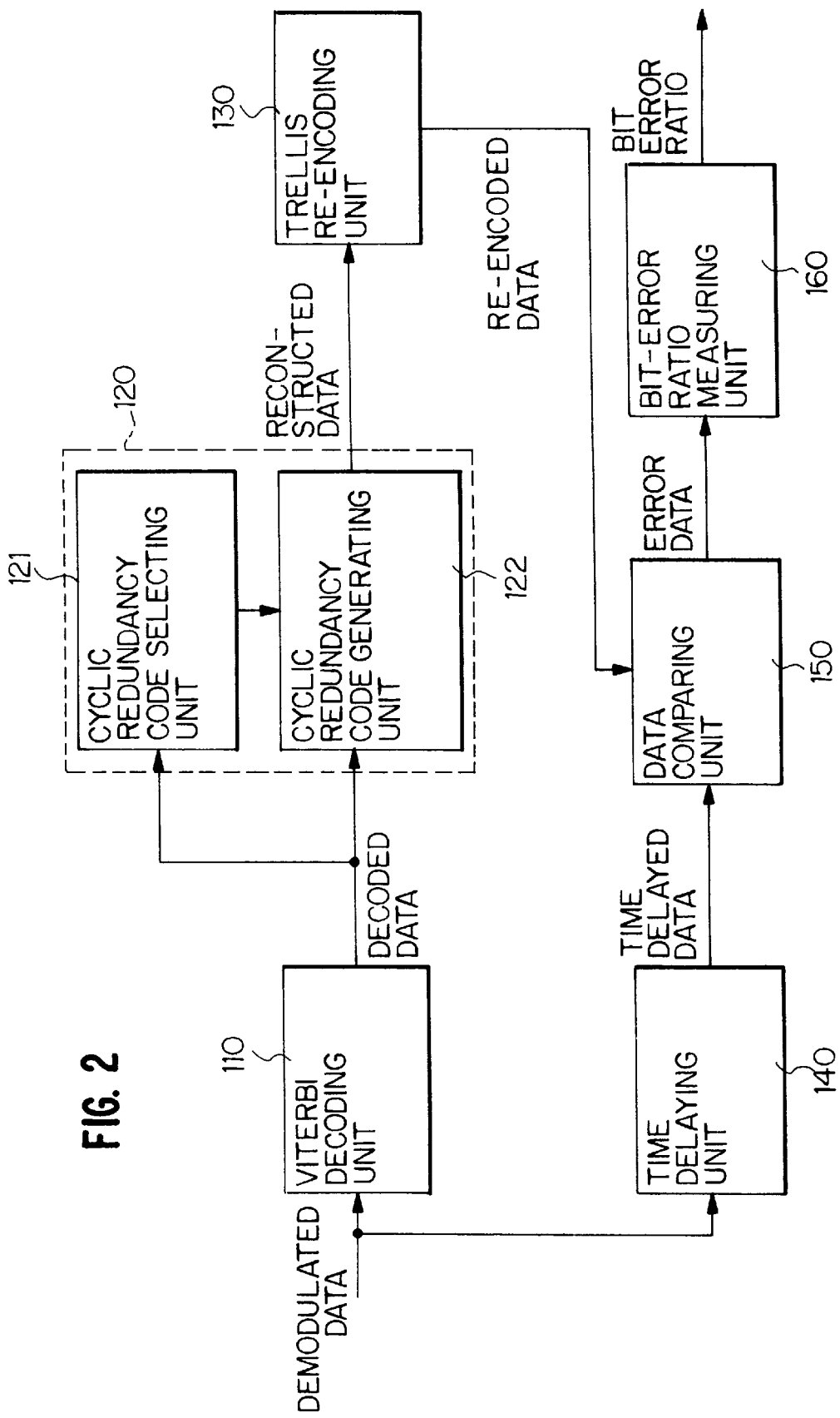
FIG. 2 is a block diagram of a bit error ratio measuring apparatus according the present invention.

FIG. 2 is a block diagram of a bit error ratio measuring apparatus according to the present invention. The apparatus comprises the following units:

a viterbi decoding unit 110 that decodes demodulated trellis encoded data, using a maximum likelihood decoding method;

a cyclic redundancy code regeneration unit 120 that receives decoded data from the viterbi decoding unit 110, removes cyclic redundancy codes from the voice information and adds new cyclic redundancy codes to the voice information;

a trellis re-encoding unit 130 that receives reconstructed data from the cyclic redundancy code regeneration unit 120 and trellis encodes the reconstructed data in the same manner as performed by the transmitter trellis encoder;

a time delaying unit 140 that receives and delays demodulated data for an amount of time necessary to compensate for the delay caused as data are processed by the viterbi decoding unit 110, the cyclic redundancy code regeneration unit 120, and the trellis re-encoding unit 130;

a data comparing unit 150 that compares the re-encoded data from the trellis re-encoding unit 130 with the time delayed data from the time delaying unit 140 and generates error data which include bits with errors and bits without errors; and a bit error ratio measuring unit 160 that calculates a bit error ratio based on the error data from the data comparing unit 150.

The cyclic redundancy code regeneration unit 120 also includes two subunits. The first is a cyclic redundancy code selecting unit 121 that detects the number of cyclic redundancy bits that were added prior to transmission and selects a method for adding the new cyclic redundancy codes. The other is a cyclic redundancy code generating unit 122 that generates new cyclic redundancy codes, based on an input from the cyclic redundancy code selecting unit 121, and adds the new cyclic redundancy codes to the voice information.

The operation of a preferred embodiment of the bit error measuring apparatus will now be described with reference to FIGS. 2, 3A and 3B.

The data demodulated by a receiver demodulator are in the same form as data encoded by a transmitter trellis encoder, except some bits contain errors generated by noise, fading, and interference signals in the transmission channel. The demodulated data, including bits containing errors, are corrected as they are processed by the viterbi decoder 110. The resulting decoded data are in the same frame form as constructed at the transmitter.

Figure 3A:
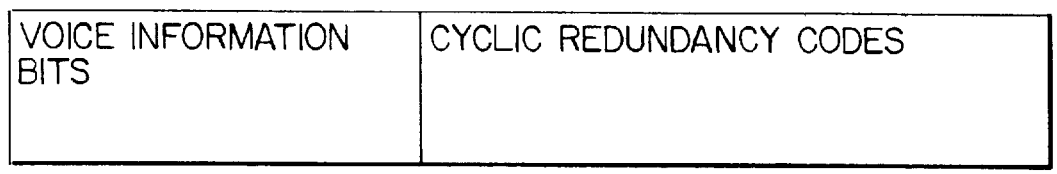
FIG. 3A and 3B show the format of the frames according to the present invention.
Figure 3B:
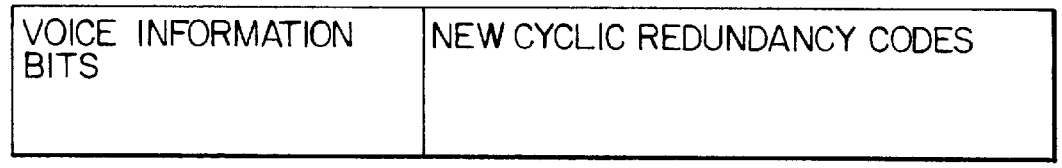

The decoded data from the transmitter, as shown in FIG. 3A, consist of a voice information element and a cyclic redundancy code element that are joined together. The cyclic redundancy code regeneration unit 120 receives the decoded data from the viterbi decoding unit 110 and removes the cyclic redundancy codes. Next, the cyclic redundancy code regeneration unit 120 generates new cyclic redundancy codes by using the voice information in the same manner as the transmitter and adds the new cyclic redundancy codes to the voice information forming a frame, as shown in FIG. 3B.

The specific operation of the cyclic redundancy code regeneration unit 120 is as follows. The cyclic redundancy code regeneration unit receives the decoded data from the viterbi decoding unit 110 and removes the cyclic redundancy codes from the decoded data. Then the cyclic redundancy code selecting unit 121 detects the number of cyclic redundancy code bits that were added prior to transmission and selects the method for adding new cyclic redundancy codes. The cyclic redundancy code generating unit 122 generates new cyclic redundancy codes, based on an input from the cyclic redundancy code selecting unit 121, and adds the new codes to the voice information. The new cyclic redundancy codes are generated based on the decoded data from the viterbi decoder 110. Therefore, if errors occur in the decoded data, the new cyclic redundancy codes may be different from the cyclic redundancy codes that were added to the voice information prior to transmission.

If an error occurs in one of the bits of the voice information data and the cyclic redundancy codes forming a frame, the data comparing unit 150 determines that an error has occurred in the frame. Therefore, when the error occurs in bits of the cyclic redundancy codes, the cyclic redundancy codes generating unit 122 removes the cyclic redundancy codes and generates the new cyclic redundancy codes. Thereafter, the cyclic redundancy codes generating unit 122 adds them to the voice information so that the voice information is similar to the data from the transmitter. This is the reason for removing the cyclic redundancy codes from the voice information transmitted from the transmitter and adding the new cyclic redundancy codes to the information data.

The trellis re-encoding unit 130 receives the output from the cyclic redundancy generating unit 122 consisting of the voice information joined with the new cyclic redundancy codes and generates trellis encoded data in the same manner as the transmitter trellis encoder.

Because the re-encoded trellis data are delayed as a result of being processed by the viterbi decoding unit 110, the cyclic redundancy code regeneration unit 120, and the trellis re-encoding unit 130, the time delaying unit 140 causes the demodulated data to be delayed for a similar amount of time before being input into the data comparing unit 156. The data comparing unit compares the time delayed data from the time delaying unit 140 with the re-encoded data from the trellis re-encoding unit, distinguishes bits with errors and bits without errors and outputs error data. The bit error ratio measuring unit 160 receives the error data from the data comparing unit 150 and calculates the number of bits having errors. Finally, the bit error ratio measuring unit 160 calculates the ratio of the number of bits having errors to the number of total bits.

Because the bit error ratio measuring unit 160 of the present invention accurately measures a bit error ratio of the demodulated data, the correct transmission rate can be determined. This causes the electric power consumption by the terminal to be reduced. Furthermore, interference signals effecting other terminals can be reduced.

Although a preferred embodiment of the present invention has been discussed for illustrative purposes. Those skilled in the art will appreciate that various modifications, addition and substitutions are possible without departing from the scope and spirit of the invention as disclosed in the accompanying claims.

What is claimed is:

1. An apparatus for measuring a bit error ratio by using a viterbi decoder comprising:

a viterbi decoding unit that decodes demodulated trellis encoded data by using a maximum likelihood decoding method;

a cyclic redundancy code regenerating unit; and a trellis re-encoding unit that receives reconstructed data from said cyclic redundancy code regenerating unit and trellis encodes said reconstructed data wherein said cyclic redundancy code regenerating unit is disposed between said viterbi decoding unit and said trellis re-encoding unit, receives from said viterbi decoding unit decoded data that contains cyclic redundancy code bits, removes said cyclic redundancy codes, and generates and adds new cyclic redundancy code bits wherein said demodulated trellis encoded data is voice information, transmitted from a transmitter, to which cyclic redundancy codes bits have been added and which has been trellis encoded prior to transmission;

wherein said reconstructed data is trellis encoded in the same manner said voice information was trellis encoded prior to transmission; and wherein said new cyclic redundancy codes bits are added to said voice information.

2. An apparatus for measuring a bit error ratio by using a viterbi decoder as claimed in claim 1, further comprising:

a time delaying unit that receives and delays demodulated data to compensate for a delay caused as data are processed by said viterbi decoding unit, said cyclic redundancy code regeneration unit, and said trellis re-encoding unit;

a data comparing unit that compares re-encoded data from said trellis re-encoding unit with time delayed data from said time delaying unit and generates error data which includes bits with errors and bits without errors;

a bit error ratio measuring unit that calculates a bit error ratio based on said error data from said data comparing unit.

3. An apparatus for measuring a bit error ratio using a viterbi decoder as claimed in claim 1, wherein said cyclic redundancy code regeneration unit further comprises:

a cyclic redundancy code selecting unit that detects the number of said cyclic redundancy code bits that were added prior to transmission and selects a method for adding said new cyclic redundancy code bits; and a cyclic redundancy code generating unit that generates said new cyclic redundancy code bits, based on an input from said cyclic redundancy code selecting unit and adds said new cyclic redundancy codes to said voice information.

* * * * *